United States Patent
Miyata et al.

(10) Patent No.: US 7,723,826 B2
(45) Date of Patent: May 25, 2010

(54) SEMICONDUCTOR WAFER, SEMICONDUCTOR CHIP CUT FROM THE SEMICONDUCTOR WAFER, AND METHOD OF MANUFACTURING SEMICONDUCTOR WAFER

(75) Inventors: Masanori Miyata, Hyogo (JP); Hidetsugu Miyake, Hyogo (JP); Tadao Uehara, Hyogo (JP); Fumihiro Fuchino, Hyogo (JP); Mikinori Oguni, Hyogo (JP); Akira Washino, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 58 days.

(21) Appl. No.: 12/211,862

(22) Filed: Sep. 17, 2008

(65) Prior Publication Data
US 2009/0079095 A1 Mar. 26, 2009

(30) Foreign Application Priority Data
Sep. 26, 2007 (JP) .............................. 2007-248318

(51) Int. Cl.
H01L 23/544 (2006.01)
(52) U.S. Cl. ................. 257/620; 438/14; 257/E21.525; 257/E23.179
(58) Field of Classification Search .................. 257/48, 257/443, 457, 459, 620, E21.525, E23.179; 438/11, 14
See application file for complete search history.

(56) References Cited

U.S. PATENT DOCUMENTS

2009/0272973 A1* 11/2009 Yoshida et al. ................. 257/48

FOREIGN PATENT DOCUMENTS

| JP | 4-111438 | 4/1992 |
|---|---|---|
| JP | 2000-228341 | 8/2000 |
| JP | 2006-100466 | 4/2006 |
| JP | 2007-46085 | 2/2007 |

* cited by examiner

Primary Examiner—Quoc D Hoang
(74) Attorney, Agent, or Firm—Dickstein Shapiro LLP

(57) ABSTRACT

A disclosed semiconductor wafer includes plural semiconductor chip areas each having a color pattern capable of tracing the positional information of the semiconductor chip with respect to the semiconductor wafer. Each of the plural semiconductor chip areas arranged in a matrix manner on the semiconductor wafer includes an underlying insulation film; a wiring pattern and a frame-shaped wiring dummy pattern formed on the underlying insulation film; and plural insulation films formed on the upper side of the underlying insulation film, the wiring pattern, and the wiring dummy pattern. At least one SOG film is included in the plural insulation films, in which a color pattern in accordance with a distance from the center of the semiconductor wafer based on the SOG film is formed on a surface of the insulator film within the wiring dummy pattern in top view.

20 Claims, 8 Drawing Sheets (A) 100 μm (B) 30 μm (A) 10 μm (B) 100 μm (A)  (B)

FIG.12
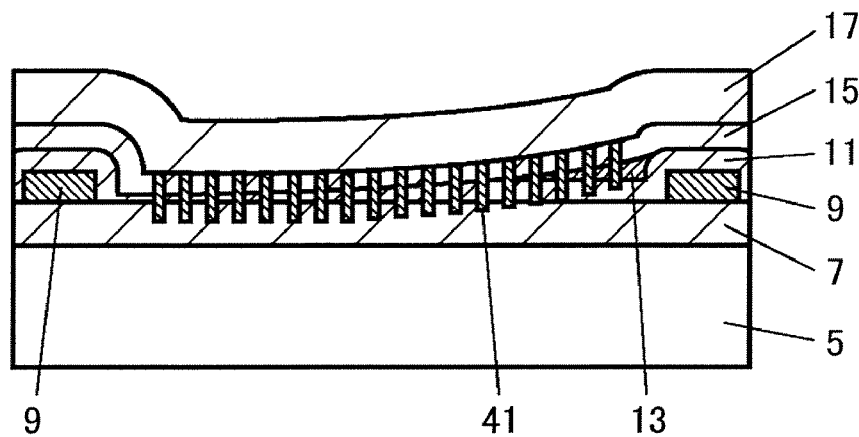
FIG.13
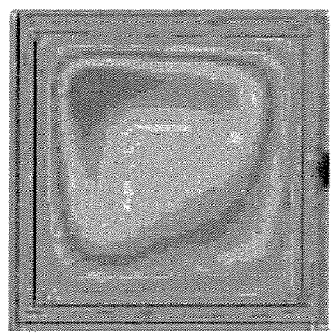 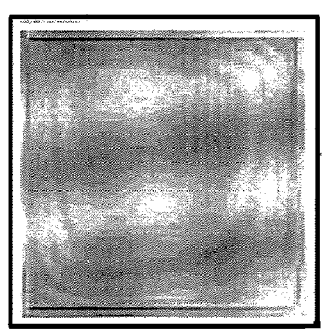
(A)            (B)

SEMICONDUCTOR WAFER, SEMICONDUCTOR CHIP CUT FROM THE SEMICONDUCTOR WAFER, AND METHOD OF MANUFACTURING SEMICONDUCTOR WAFER

CROSS-REFERENCE TO RELATED APPLICATIONS

The present application claims priority under 35 U.S.C. §119 to Japanese Patent Application Publication No. 2007-248318 filed Sep. 26, 2007, the entire contents of which are hereby incorporated herein by reference.

BACKGROUND OF THE INVENTION

1. Field of the Invention

The present invention generally relates to a semiconductor wafer on which plural semiconductor chips are arranged in a matrix manner, a semiconductor chip cut from the semiconductor wafer, and a method of manufacturing the semiconductor wafer.

2. Description of the Related Art

When a defect of a semiconductor chip is found after the semiconductor chip is mounted on a product and shipped to market, individual information, or so-called traceability of manufacturing information, of the defective chip becomes extremely important for analyzing the cause of the defect. The individual information includes what manufacturing process has been applied to the chip. To that end, various methods of providing the individual information regarding the manufacturing process (such as a lot number, a wafer number, a chip address) have been disclosed.

For example, according to a method disclosed in Japanese Patent Application Publication No. H4-111438, plural fuses are formed on a semiconductor chip (hereinafter may be abbreviated as "a chip"), and a prescribed fuse(s) among the formed fuses is cut so that the individual information of the manufacturing process can be indicated.

Further according to Japanese Patent Application Publication No. 2000-228341, a method of forming a pattern in a chip by using an exposure apparatus, a method of writing the individual information using a laser, and a method of supplying the individual information to a programmable random access memory (PROM) through the input terminal of the PROM are disclosed.

However, when the method of cutting the fuse(s) as disclosed in Japanese Patent Application Publication No. H4-111438 is used, an extra step of cutting the fuse(s) becomes necessary, thereby increasing the number of manufacturing steps.

On the other hand, when any of the methods disclosed in Japanese Patent Application Publication No. 2000-228341 is used, there is also a drawback. For example, when a different pattern is attempted to be formed on each of the chips using an exposure apparatus, the exposing process time may be greatly increased. Further, when information is attempted to be input to the chip by using a laser or through the input terminal of the PROM, an extra step of inputting the information becomes necessary, thereby increasing the number of manufacturing steps.

Further, when more and more items of the individual information such as the lot number, the wafer number, and positional information of the chip on the wafer surface become necessary for each semiconductor chip, the amount of information is accordingly increased and managing the information becomes more difficult. Further, recently and continuing to the present, the size of a semiconductor chip is becoming smaller and smaller and the amount of information indicating the relative position of the semiconductor chip with respect to the semiconductor wafer is increasing.

To obtain the positional information of a chip on a wafer surface, a method has been used in which a single mask pattern for the whole surface of the wafer is used. In this method, different patterns for each of the chips are included in the mask pattern, so that each chip has its separate positional information. However, soon, this method may not be good enough. This is because semiconductor chips have become more and more highly integrated and densely fabricated. As a result, a method is becoming more and more used in which a single mask pattern is repeatedly exposed in several shots on a wafer surface by scanning the exposure position, so that a pattern for the whole surface of the wafer is formed by the repeated exposure of the same mask pattern. Unfortunately, when this method is used, it is difficult to obtain accurate positional information of the chip on the wafer even if different patterns for each chip are formed on the single mask pattern.

SUMMARY OF THE INVENTION

The present invention is made in light of the above circumstances and may provide a semiconductor wafer, a semiconductor chip, and a method of manufacturing a semiconductor wafer capable of tracing and specifying the positional information of the semiconductor chip with respect to the semiconductor wafer.

According to an aspect of the present invention, there is provided a semiconductor wafer having plural semiconductor chip areas arranged in a matrix manner on the semiconductor wafer. Each of the semiconductor chip areas includes an underlying insulation film, a wiring pattern and a frame-shaped wiring dummy pattern formed on the underlying insulation film, and plural insulation films formed on the upper side of the underlying insulation film, the wiring pattern, and the wiring dummy pattern. Further, at least one Spin On Glass (SOG) film is included in the plural insulation films. Because of this structure, a color pattern in accordance with a distance from the center of the semiconductor wafer based on the SOG film may be formed on a surface of the insulator film within the wiring dummy pattern in top view (viewable from above the chip).

According to another aspect of the present invention, there is provided a semiconductor chip cut from the semiconductor wafer according an embodiment of the present invention.

According to still another aspect of the present invention, there is provided a method of manufacturing a semiconductor wafer on which plural semiconductor chip areas are arranged in a matrix manner. The method includes a step of forming a wiring pattern and a frame-shaped wiring dummy pattern on an underlying insulation film in each of the semiconductor chip areas; and a step of forming plural insulation films including at least one SOG film on the upper side of the underlying insulation film, the wiring pattern, and the wiring dummy pattern. By doing this, a color pattern in accordance with a distance from the center of the semiconductor wafer based on the SOG film may be formed on a surface of the insulator film within the wiring dummy pattern in top view.

It should be noted that in a semiconductor wafer, a semiconductor chip, and a method of manufacturing a semiconductor wafer according to an embodiment of the present invention, the shape of the wiring dummy pattern is not limited to the frame-shape. For example, any shape such as a discontinuous frame shape including a slit portion may be used as long as the color pattern is observed.

On the other hand, it is observed the thickness of the SOG film within a specific wiring pattern such as a frame-shaped wiring pattern is apt to be less as the distance between the position of the SOG film and the center of the semiconductor wafer becomes shorter. This trend becomes remarkable as the distance between the position of the SOG film and the center of the semiconductor wafer becomes longer (namely, as the SOG film approaches the peripheral region of the semiconductor wafer).

By using this feature, in a semiconductor wafer, a semiconductor chip, and a method of manufacturing a semiconductor wafer according to an embodiment of the present invention, the relative position of the semiconductor chip area with respect to the semiconductor wafer may be traced and specified. As described above, in a semiconductor wafer and a semiconductor wafer manufactured based on a manufacturing method according to an embodiment of the present invention, each of the semiconductor chip areas of the semiconductor wafer includes an underlying insulation film, a frame-shaped wiring dummy pattern formed on the underlying insulation film, plural insulation films formed on the upper side of the underlying insulation film and the wiring dummy pattern, and at least one SOG film in the plural insulation films. Because of this structure, a color pattern in accordance with a distance from the center of the semiconductor wafer based on the SOG film may be formed on a surface of the insulator film within the wiring dummy pattern in top view. Further and advantageously, the color pattern may be formed in a manner so that the color pattern has a certain directionality with respect to the direction to the center of the semiconductor wafer. Because of this feature, by observing the color pattern on a semiconductor chip cut from a semiconductor wafer, it becomes possible to trace and specify the relative position of the semiconductor chip with respect to the semiconductor wafer. Further, the number of the manufacturing steps may not be increased because the wiring dummy pattern may be formed at the same time when the wiring patterns for supplying power and signal processing are formed.

In a semiconductor wafer and a method of manufacturing a semiconductor wafer according to an embodiment of the present invention, the shape of the wiring dummy pattern may be a rectangle, and more preferably a square.

Further, preferably, the one-side lengths of the contour inner circumference of the wiring dummy pattern are in a range from 50 μm to 100 μm.

Further, preferably, the line width of the wired dummy pattern is equal to or less than 10 μm.

Further, in a semiconductor wafer according to an embodiment of the present invention, the underlying insulation film within the wiring dummy pattern is removed.

In a method of manufacturing a semiconductor wafer according to an embodiment of the present invention, the method includes a step of removing the underlying insulation film within the wiring dummy pattern before a step of forming the SOG film.

Further, the step of removing the underlying insulation film may be performed at the same time when contact holes are formed in the underlying insulation film.

Further, in a semiconductor wafer according to an embodiment of the present invention, there may be plural insulation films on the upper side of the SOG film, and a part of the plural insulation films on the upper side of the SOG film and within the wiring dummy pattern in top view may be removed. For example, the removed part of the plural insulation films on the upper side of the SOG film is a final passivation film.

In a method of manufacturing a semiconductor wafer according to an embodiment of the present invention, the step of forming plural insulation films may be a step of forming plural insulation films on the SOG film, and includes a step of removing a part of the plural insulation films on the upper side of the SOG film and within the wiring dummy pattern in top view. For example, the step of removing the part of the plural insulation films on the upper side of the SOG film refers to a step of removing a final passivation film. Further, the step of removing the final passivation film may be performed at the same time when an electrode pad opening is formed in the final passivation film.

Further, in a semiconductor wafer according to an embodiment of the present invention, plural dummy contact holes may be formed in the insulation film on the upper side of the SOG film and within the wiring dummy pattern in top view.

In a method of manufacturing a semiconductor wafer according to an embodiment of the present invention, the step of forming plural insulation films may be a step of forming the plural insulation films on the SOG film, and include a step of forming plural dummy contact holes in the insulation film on the upper side of the SOG film and within in the wiring dummy pattern in top view. Further, the step of forming the plural dummy contact holes may be performed at the same time when a dummy contact hole in the insulation film on the upper side of the SOG film is formed.

The planar sizes of the formed contact holes may differ from each other due to the height difference of the insulation film to be etched when a photoresist pattern is formed in a photo engraving process, even though the planer sizes of the contact holes on the exposure photomask are the same. In a semiconductor wafer and a method of manufacturing a semiconductor wafer according to an embodiment of the present invention, the height of the insulation layer in the center region of the semiconductor wafer may be different from that in the peripheral region of the semiconductor wafer due to the existence of the SOG film. As a result, the planar sizes of the dummy contact holes differ from each other in accordance with the distance from the center of the semiconductor wafer.

Further, in a semiconductor wafer according to an embodiment of the present invention, each of the semiconductor chip areas may further include plural metal wiring layers, and the wiring dummy pattern may be formed of a metal of the uppermost metal wiring layer.

In a method of manufacturing a semiconductor wafer according to an embodiment of the present invention, each of the semiconductor chip areas may further include plural metal wiring layers, and the wiring dummy pattern may be formed of a metal of the uppermost metal wiring layer.

Further, in a semiconductor wafer according to an embodiment of the present invention, each of the semiconductor chip areas may further include plural metal wiring layers, and the wiring dummy patterns may be formed in the plural metal wiring layers.

In a method of manufacturing a semiconductor wafer according to an embodiment of the present invention, each of the semiconductor chip areas may further include plural metal wiring layers, and the wiring dummy patterns may be formed in the plural metal wiring layers.

Further, in a semiconductor wafer according to an embodiment of the present invention, the semiconductor chip areas may be formed by using an exposure photomask having a pattern corresponding to plural semiconductor chip areas and performing plural exposure processes while a position of the exposure is scanned, and a position recognition pattern indicating the relative position in one exposure range may be formed in each of the semiconductor chip areas.

In a method of manufacturing a semiconductor wafer according to an embodiment of the present invention, the semiconductor chip area may be formed by using an exposure photomask having a pattern corresponding to plural semiconductor chip areas and performing plural exposure processes while a position of the exposure is scanned for each pattern layer, and at least one of plural kinds of exposure photomasks prepared for the corresponding pattern layers and including a position recognition pattern indicating a relative position in one exposure range may be used, so that the position recognition pattern indicating a relative position in one exposure range is formed on each semiconductor chip area.

In a semiconductor wafer according to an embodiment of the present invention, a semiconductor wafer has plural semiconductor chip areas arranged in a matrix manner on the semiconductor wafer. Each of the semiconductor chip areas includes an underlying insulation film, a wiring pattern and a frame-shaped wiring dummy pattern formed on the underlying insulation film, and plural insulation films formed on the upper side of the underlying insulation film, the wiring pattern, and the wiring dummy pattern. Further, at least one SOG film is included in the plural insulation films. Because of this structre, a color pattern in accordance with a distance from the center of the semiconductor wafer based on the SOG film may be formed on a surface of the insulator film within the wiring dummy pattern in top view.

According to an embodiment of the present invention, a semiconductor chip is cut from the semiconductor wafer according an embodiment of the present invention.

In a method of manufacturing a semiconductor wafer according to an embodiment of the present invention, a method of manufacturing a semiconductor wafer on which plural semiconductor chip areas are arranged in a matrix manner includes a step of forming a wiring pattern and a frame-shaped wiring dummy pattern on an underlying insulation film in each of the semiconductor chip areas; and a step of forming plural insulation films including at least one SOG film on the upper side of the underlying insulation film, the wiring pattern, and the wiring dummy pattern. By doing this, a color pattern in accordance with a distance from the center of the semiconductor wafer based on the SOG film may be formed on a surface of the insulator film within the wiring dummy pattern in top view.

Because of the structure, advantageously, by observing the color pattern of a semiconductor chip cut from a semiconductor wafer, it becomes possible to trace and specify the relative position of the semiconductor chip with respect to the semiconductor wafer. Further, advantageously, the number of the manufacturing steps may not be increased because the wiring dummy pattern may be formed at the same time when the wiring patterns for supplying power and signal processing are formed.

In a semiconductor wafer and a method of manufacturing a semiconductor wafer according an embodiment of the present invention, the shape of the wiring dummy pattern may be a rectangle, and more preferably a square. By doing this, it becomes possible to easily generate a color pattern having directionality on a surface of the insulation film within the wiring dummy pattern in top view.

Further, preferably, the one-side lengths of the contour inner circumference of the wiring dummy pattern are in a range from 50 μm to 100 μm. By doing this, it becomes possible to easily generate a color pattern having directionality on a surface of the insulation film within the wiring dummy pattern in top view.

Further, preferably, the line width of the wired dummy pattern is equal to or less than 10 μm. By doing this, it becomes possible to easily generate a color pattern having directionality on a surface of the insulation film within the wiring dummy pattern in top view.

Further, in a semiconductor wafer according to an embodiment of the present invention, the underlying insulation film within the wiring dummy pattern may be removed.

In a method of manufacturing a semiconductor wafer according to an embodiment of the present invention, the method may include a step of removing the underlying insulation film within the wiring dummy pattern before a step of forming the SOG film.

By doing this, the thickness of the insulation film within the wiring dummy pattern may be less than that of any other areas. By reducing the thickness of the insulation film within the wiring dummy pattern, the color pattern in top view may be observed more easily, thereby enabling easily specifying the relative position of the semiconductor chip area with respect to the semiconductor wafer.

Further, the step of removing the underlying insulation film may be performed at the same time when contact holes are formed in the underlying insulation film. By doing this, the number of manufacturing steps may not be increased.

Further, in a semiconductor wafer according to an embodiment of the present invention, there may be plural insulation films on the upper side of the SOG film, and a part of the plural insulation films on the upper side of the SOG film and within the wiring dummy pattern in top view may be removed. For example, the removed part of the plural insulation films on the upper side of the SOG film is a final passivation film.

In a method of manufacturing a semiconductor wafer according to an embodiment of the present invention, the step of forming plural insulation films may be a step of forming plural insulation films on the SOG film, and include a step of removing a part of the plural insulation films on the upper side of the SOG film and within the wiring dummy pattern in top view. For example, the step of removing the part of the plural insulation films on the upper side of the SOG film refers to a step of removing a final passivation film. For example, the step of removing the final passivation film may be performed at the same time when an electrode pad opening is formed in the final passivation film.

By doing this, the thickness of the insulation film within the wiring dummy pattern may be less than that of any other areas. By reducing the thickness of the insulation film within the wiring dummy pattern, the color pattern in top view may be observed more easily, thereby enabling easily specifying the relative position of the semiconductor chip area with respect to the semiconductor wafer.

Further, in a semiconductor wafer according to an embodiment of the present invention, plural dummy contact holes may be formed in the insulation film on the upper side of the SOG film and within the wiring dummy pattern in top view.

In a method of manufacturing a semiconductor wafer according to an embodiment of the present invention, the step of forming plural insulation films may be a step of forming the plural insulation films on the SOG film, and include a step of forming plural dummy contact holes in the insulation film on the upper side of the SOG film and within in the wiring dummy pattern in top view.

By doing this, the planar sizes of the dummy contact holes differ from each other in accordance with the distance from the center of the semiconductor wafer. As a result, it becomes possible to trace and specify the relative position of the semiconductor chip with respect to the semiconductor wafer.

Further, the step of forming the plural dummy contact holes may be performed at the same time when a dummy contact hole in the insulation film on the upper side of the SOG film is formed. By doing this, the number of manufacturing steps may not be increased.

Further, in a semiconductor wafer according to an embodiment of the present invention, each of the semiconductor chip areas may further include plural metal wiring layers, and the wiring dummy pattern may be formed of a metal of the uppermost metal wiring layer.

In a method of manufacturing a semiconductor wafer according to an embodiment of the present invention, each of the semiconductor chip areas may further include plural metal wiring layers, and the wiring dummy pattern may be formed of a metal of the uppermost metal wiring layer.

By doing this, compared with a case where the wiring dummy pattern is formed of a metal for wiring on the lower side, the thickness of the insulation film within the wiring dummy pattern in top view may be less. By reducing the thickness of the insulation film within the wiring dummy pattern, the color pattern in top view may be observed more easily, thereby enabling easily specifying the relative position of the semiconductor chip area with respect to the semiconductor wafer.

Further, in a semiconductor wafer according to an embodiment of the present invention, each of the semiconductor chip areas may further include plural metal wiring layers, and the wiring dummy patterns may be formed in the plural metal wiring layers.

In a method of manufacturing a semiconductor wafer according to an embodiment of the present invention, each of the semiconductor chip areas may further include plural metal wiring layers, and the wiring dummy patterns may be formed in the plural metal wiring layers.

By doing this, the film thickness difference between the insulation film in the center region of the semiconductor wafer and the insulation film in the peripheral region of the semiconductor wafer due to the existence of the SOG film becomes greater. Therefore, the difference in the color pattern may become greater, thereby enabling easily observing the color pattern.

Further, in a semiconductor wafer according to an embodiment of the present invention, the semiconductor chip areas may be formed by using an exposure photomask having a pattern corresponding to plural semiconductor chip areas and performing plural exposure processes while a position of the exposure is scanned, and a position recognition pattern indicating the relative position in one exposure range may be formed in each of the semiconductor chip areas.

In a method of manufacturing a semiconductor wafer according to an embodiment of the present invention, the semiconductor chip area may be formed by using an exposure photomask having a pattern corresponding to plural semiconductor chip areas and performing plural exposure processes while a position of the exposure is scanned for each pattern layer, and at least one of plural kinds of exposure photomasks prepared for the corresponding pattern layers and including a position recognition pattern indicating a relative position in one exposure range may be used, so that the position recognition pattern indicating a relative position in one exposure range is formed on each semiconductor chip area.

By using the position recognition pattern, it becomes possible to determine the relative position of the semiconductor chip area in the one exposure range. As a result, the position of the semiconductor chip area in the semiconductor wafer may be determined more accurately.

BRIEF DESCRIPTION OF THE DRAWINGS

Other objects, features, and advantages of the present invention will become more apparent from the following description when read in conjunction with the accompanying drawings, in which:

Parts (A) through (C) of FIG. 1 are drawings showing a semiconductor wafer according to an embodiment of the present invention;

Figure 1:
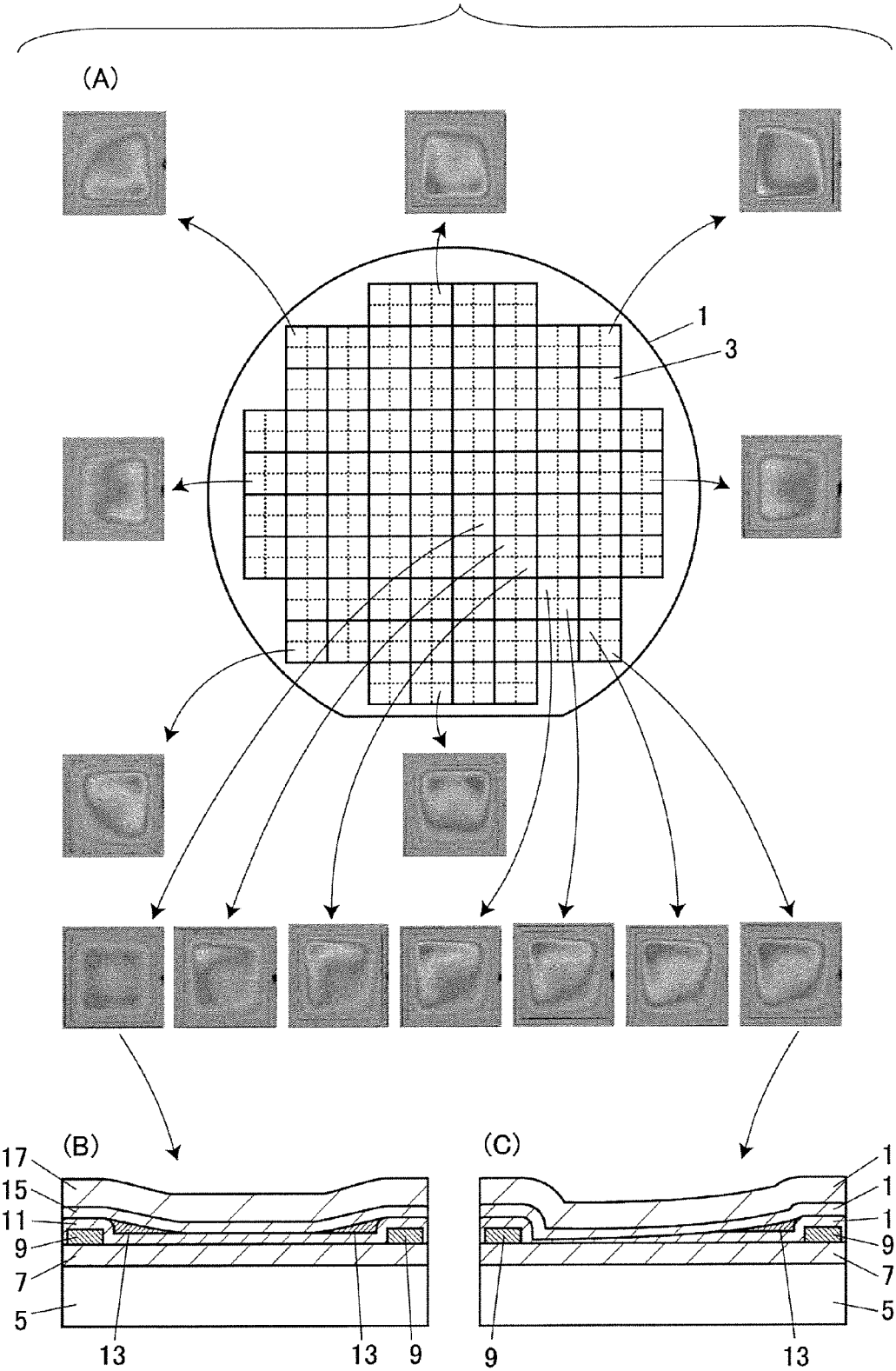
Figure 2:
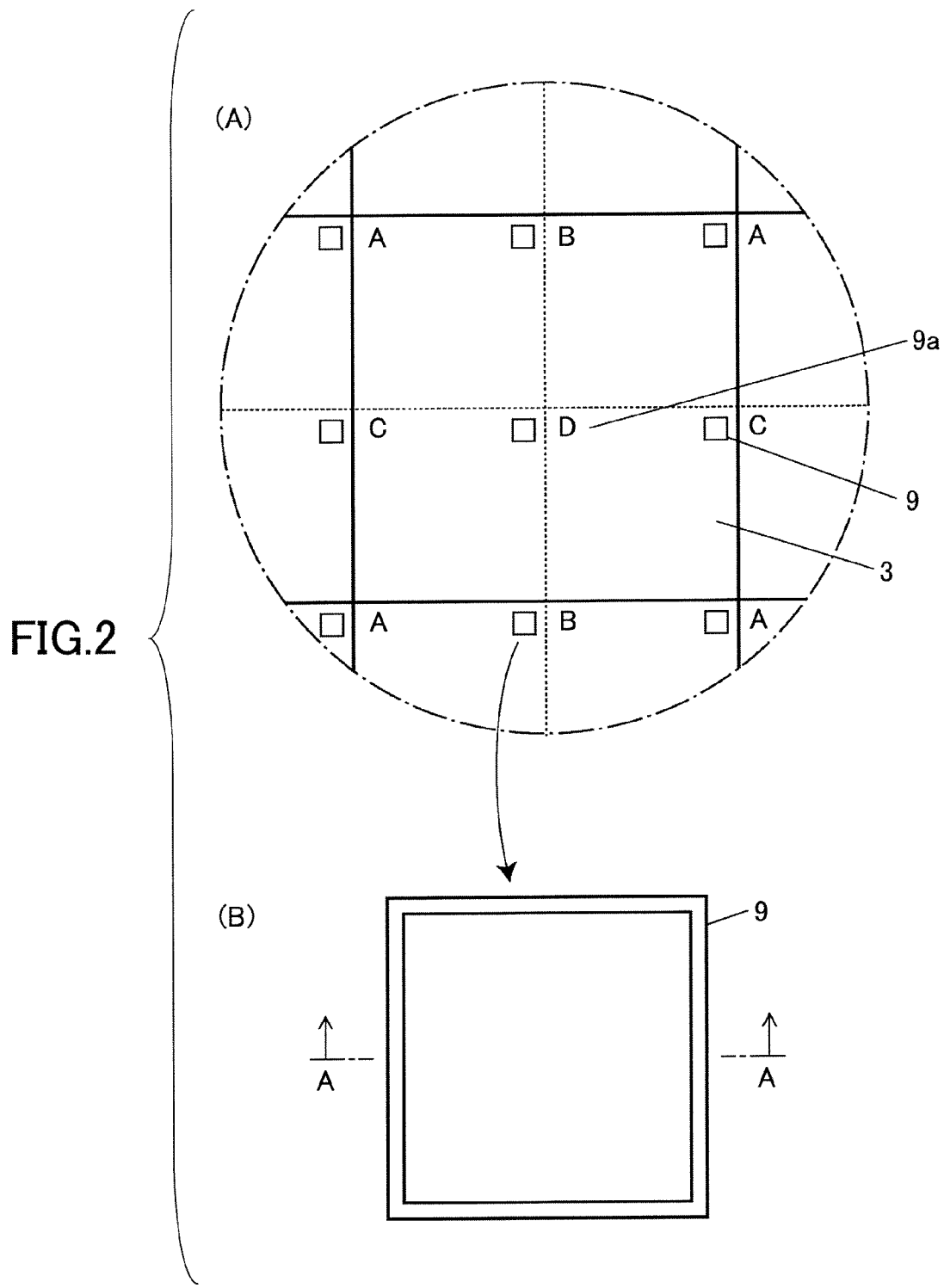
Figure 3:
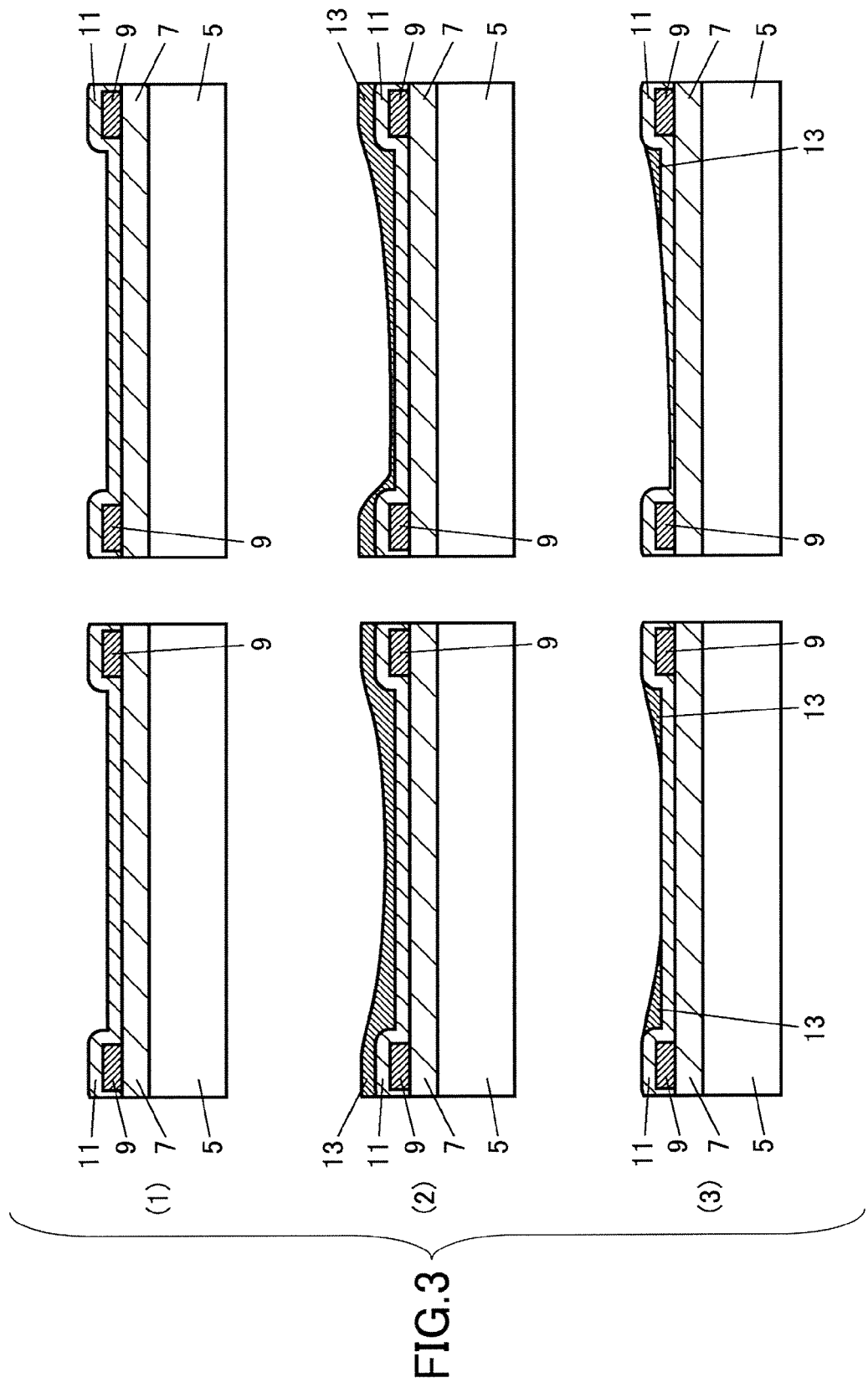
Figure 4:
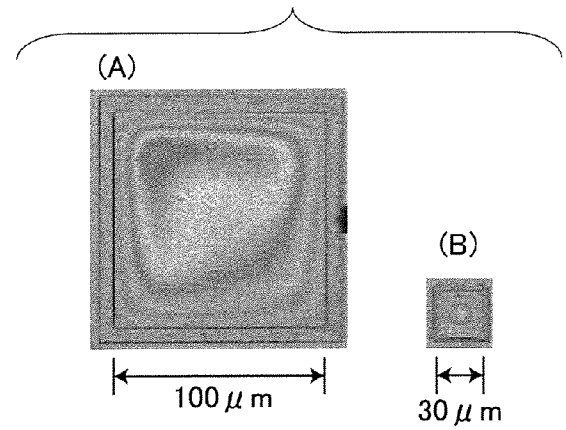
Figure 5:
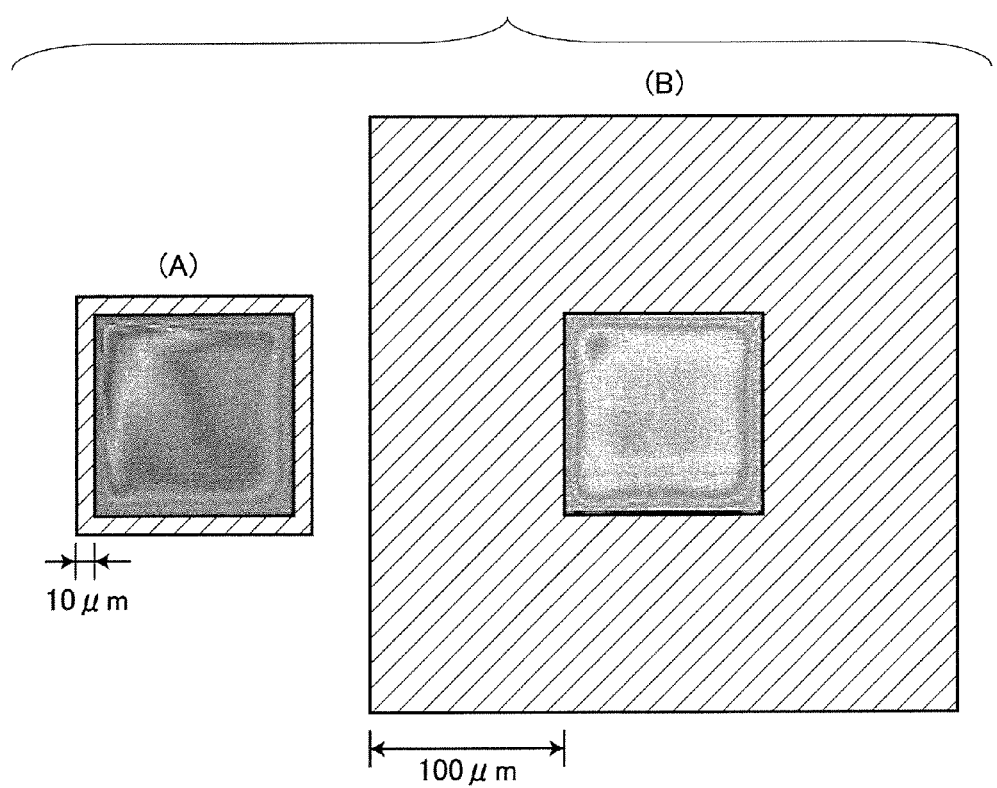
Figure 6:
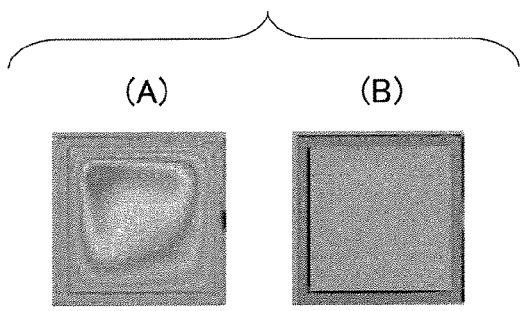
Figure 7:
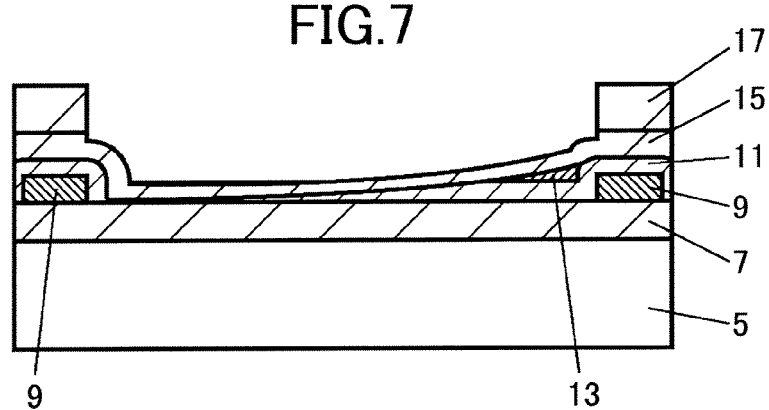
Figure 8:
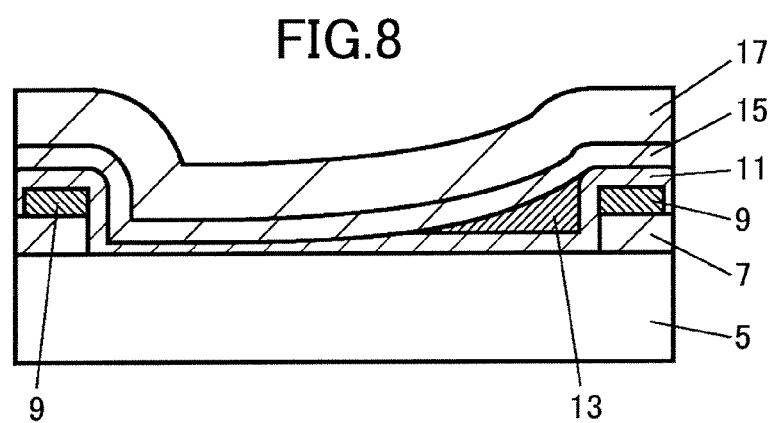
Figure 9:
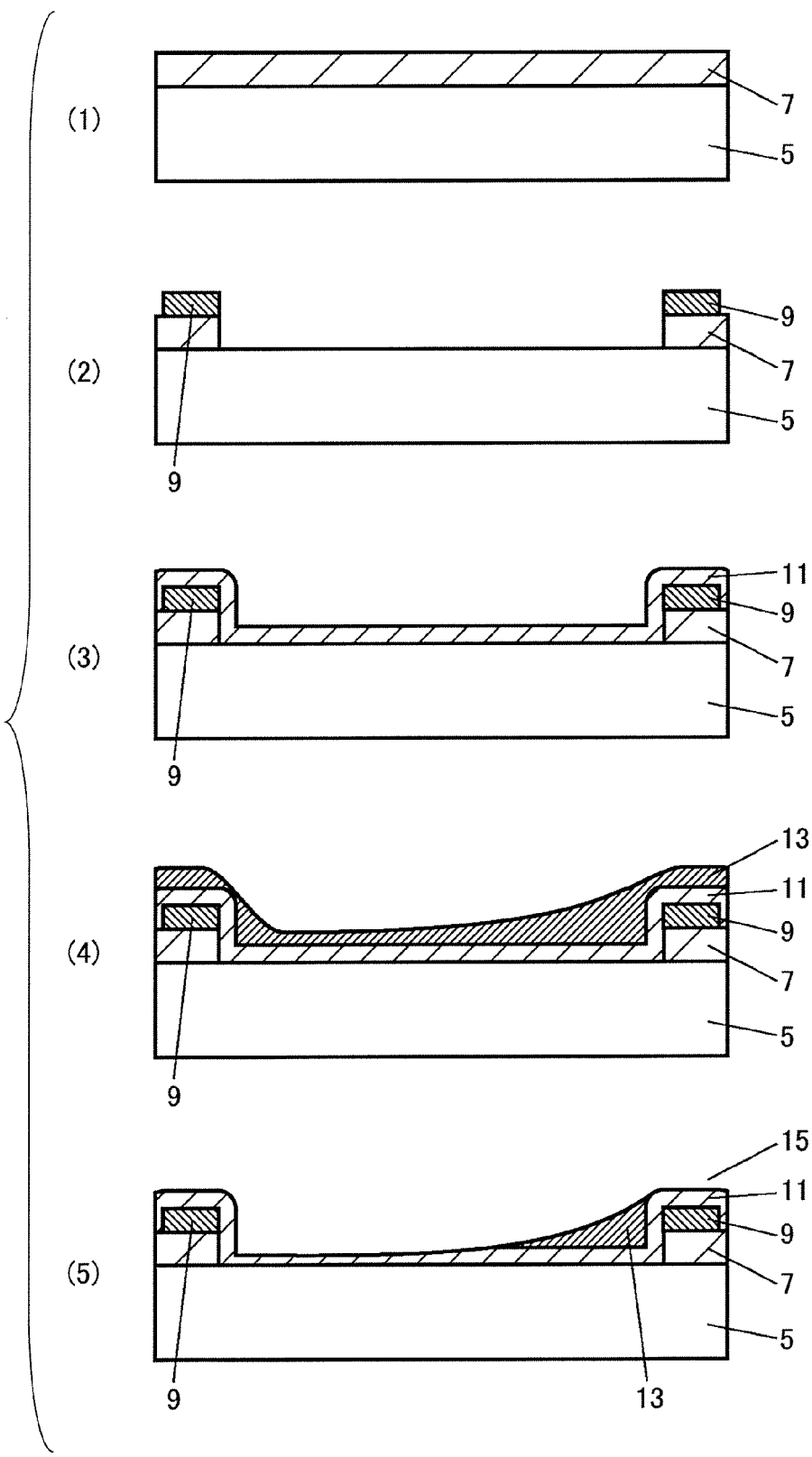
Figure 10:
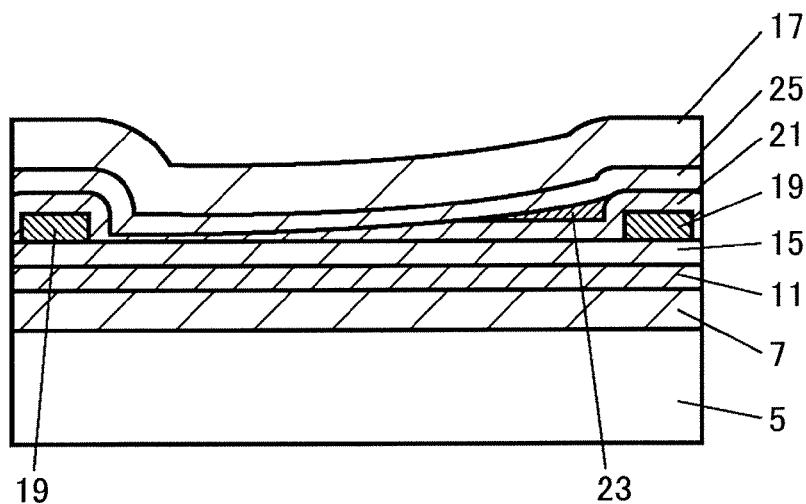
Figure 11:
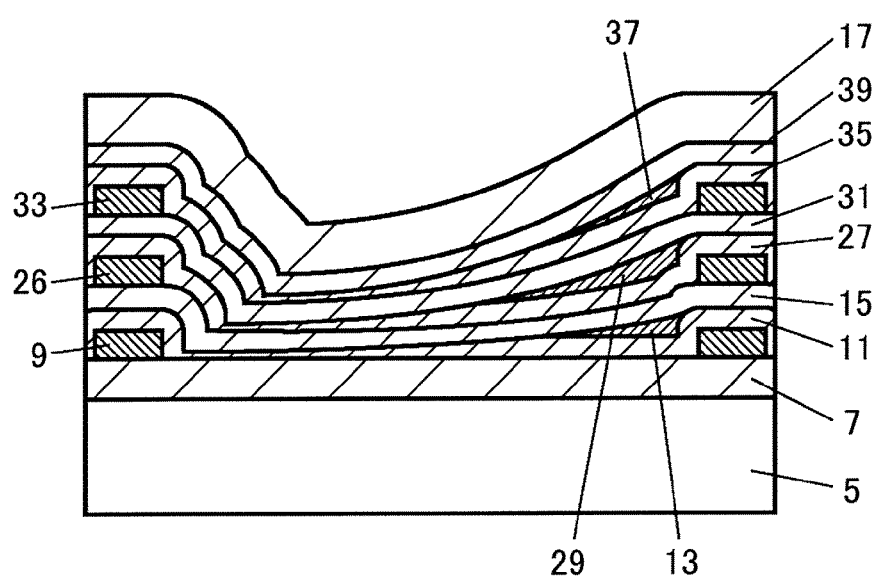

Part (A) of FIG. 1 is a plan view showing a semiconductor wafer and each of color patterns on a surface of an insulation film within a wiring dummy pattern;

Part (B) of FIG. 1 is a cross-sectional view showing the vicinity of the wiring dummy pattern in a semiconductor chip area of the center region of the semiconductor wafer;

Part (C) of FIG. 1 is a cross-sectional view showing the vicinity of the wiring dummy pattern in a semiconductor chip area of a peripheral region of the semiconductor wafer;

Part (A) of FIG. 2 is an enlarged plan view showing an area of four semiconductor chips, the area corresponding to a single shot (one exposure range) of an exposure photomask;

Part (B) of FIG. 2 is an enlarged plan view showing a frame-shaped wiring dummy pattern;

Parts (1) through (3) of FIG. 3 are process cross-sectional views illustrating an exemplary method of manufacturing a semiconductor wafer 1 according to an embodiment of the present invention;

The left hand side of FIG. 3 shows a manufacturing process of the semiconductor chip area 3 in the center region of the semiconductor wafer 1;

The right hand side of FIG. 3 show a manufacturing process of the semiconductor chip area 3 in the peripheral region of the semiconductor wafer 1;

FIG. 4 shows the relationship between the size of the wiring dummy pattern and the observed directionality of the color pattern;

Parts (A) and (B) of FIG. 4 show cases where one-side lengths of the contour inner circumference are 100 μm and 30 μm, respectively;

FIG. 5 shows the relationship between the line width of the wiring dummy pattern and the observed directionality of the color pattern;

Parts (A) and (B) of FIG. 5 show cases where line widths of the contour inner circumference are 10 μm and 100 μm, respectively;

FIG. 6 shows the relationship between the total film thickness of the insulation films within the wiring dummy pattern 9 and the observed directionality of the color pattern, in which the total film thickness of the insulation films in the case of part (A) of FIG. 6 is less than that in the case of part (B) of FIG. 6;

FIG. 7 is a cross-sectional view showing the vicinity of the wiring dummy pattern 9 of the semiconductor chip area in a peripheral region of the semiconductor wafer 1 according to another embodiment of the present invention;

FIG. 8 is a cross-sectional view showing the vicinity of the wiring dummy pattern 9 of the semiconductor chip area in a peripheral region of the semiconductor wafer according to still another embodiment of the present invention;

Parts (1) through (5) of FIG. 9 are process cross-sectional views illustrating an exemplary method of manufacturing a semiconductor wafer shown in FIG. 8 according to another embodiment of the present invention;

FIG. 10 is a cross-sectional view showing the vicinity of the wiring dummy pattern of the semiconductor chip area in a peripheral region of the semiconductor wafer according to still another embodiment of the present invention;

FIG. 11 is a cross-sectional view showing the vicinity of the wiring dummy pattern of the semiconductor chip area in a peripheral region of the semiconductor wafer according to still another embodiment of the present invention;

FIG. 12 is a cross-sectional view showing the vicinity of the wiring dummy pattern of the semiconductor chip area in a peripheral region of the semiconductor wafer according to still another embodiment of the present invention; and Part (A) and part (B) of FIG. 13 show the color patterns on the surface of the insulation film within the wiring dummy pattern in top view when the dummy via holes are not formed (Without holes) and when the dummy via holes are formed (With holes).

DETAILED DESCRIPTION OF THE PREFERRED EMBODIMENTS

In the following, exemplary embodiments of the present invention are described with reference to the accompanying drawings. FIG. 1 is a drawing illustrating a semiconductor wafer according to an embodiment of the present invention. Part (A) of FIG. 1 is a plan view showing color patterns each on a surface of an insulation film within a wiring dummy pattern in the corresponding semiconductor chip area of a semiconductor wafer. Part (B) of FIG. 1 is a cross-sectional view showing the vicinity of the dummy pattern in a semiconductor chip area of the center region of the semiconductor wafer. Part (C) of FIG. 1 is a cross-sectional view showing the vicinity of the dummy pattern in a semiconductor chip area of a peripheral region of the semiconductor wafer. Part (A) of FIG. 2 is an enlarged plan view showing an area of four semiconductor chips, the area corresponding to a single shot (one exposure range) of an exposure photomask. Part (B) of FIG. 2 is an enlarged plan view showing a frame-shaped wiring dummy pattern.

As shown in part (A) of FIG. 1, there are plural semiconductor chip areas 3 arranged in a matrix manner in X and Y directions on a semiconductor wafer 1. In this embodiment, it is assumed that each pattern layer is formed by using an exposure photomask having a pattern corresponding to, for example, four semiconductor chip areas 3. In each of part (A) of FIG. 1 and part (A) of FIG. 2, the solid lines indicate the one exposure range of the exposure photomask, and the dotted lines indicate the boundaries between each of the four semiconductor chip areas 3.

Next, a schematic configuration of the semiconductor chip area 3 is described with reference to parts (B) and (C) of FIG. 1.

A first interlayer insulation film (underlying insulation film) 7 made of silicon oxide having a film thickness of 100 μm or the like is formed on a semiconductor substrate 5. A frame-shaped wiring dummy pattern 9 made of metal material such as aluminum is formed on the first interlayer insulation film 7. The planar shape of the frame-shaped wiring dummy pattern 9 may be a square or the like. The sizes of the wiring dummy pattern 9 are, for example, 10 μm in line width, 600 μm in thickness, and 100 μm in one-side length of the contour inner circumference. A position recognition pattern 9a indicating the relative position in the one exposure range (see part (A) of FIG. 2) and wiring patterns (not shown) for supplying power and performing signal processing are formed along with the wiring dummy pattern 9 on the first interlayer insulation film 7. In this embodiment, alphabetical characters "A" through "D" are formed as the position recognition patterns 9a. However, in the present embodiment, the position recognition pattern 9a is not limited to alphabetical characters. Anything such as diagrams and symbols may be used as the position recognition patterns 9a as long as they can indicate the relative positions in the one exposure range. Further, in an embodiment of the present invention, the position recognition pattern 9a may not be necessarily formed.

A second interlayer insulation film 11 made of silicon oxide having a film thickness of, for example, 400 μm is formed on the first interlayer insulation film 7 and the wiring dummy pattern 9. An SOG film 13 is formed on the second interlayer insulation film 11. The SOG film 13 shown in parts (B) and (C) of FIG. 1 is formed in a manner so that the SOG film having a film thickness of, for example, 400 μm is formed on the second interlayer insulation film 11 by a spin coating method. Then, an etch back process is performed. As a result, the SOG film 13 is formed in the vicinity of the step portion on the surface of the second interlayer insulation film 11.

Parts (B) and (C) of FIG. 1 show that a forming area and a film thickness distribution of the SOG film 13 within the wiring dummy pattern 9 of a semiconductor chip area in the center region of the semiconductor wafer (part (B) of FIG. 1) are different from those in the peripheral region of the semiconductor wafer (part (C) of FIG. 1). These differences are generated because the SOG film 13 is formed by using the spin coating method. Namely, when the SOG film 13 is formed on the second interlayer insulation film 11 by using the spin coating method within the frame-shaped wiring dummy pattern 9, the film thickness of the SOG film 13 in the center region of the semiconductor wafer 1 becomes less than that in the peripheral region of the semiconductor wafer 1. Further, the difference of the film thickness becomes more remarkable as the semiconductor chip area 3 approaches the peripheral border of the semiconductor wafer 1. As shown in part (C) of FIG. 1, within the wiring dummy pattern 9 in the semiconductor chip area 3 in the peripheral region of the semiconductor wafer 1, the SOG film 13 in the center region is removed by the etch back process. However, the surface geometry of the removed part of the SOG film 13 is transferred to the second interlayer insulation film 11 by the etch back process. Namely, the surface geometry of the second interlayer insulation film 11 and the SOG film 13 is substantially the same as that of the SOG film 13 just after the spin coating method is performed.

A third interlayer insulation film 15 made of silicon oxide having a film thickness of, for example, 400 μm is formed on the second interlayer insulation film 11 and the SOG film 13. In the third interlayer insulation film 15, a wiring pattern(s) and an electrode pad(s) (not shown) made of metal material are formed in areas other than the area of the wiring dummy pattern 9. A final passivation film 17 made of silicon nitride film having a film thickness of, for example, 700 μm is formed on the third interlayer insulation film 15. In top view, the surface geometry of the final passivation film 17 within the wiring dummy pattern 9 reflects that of the second interlayer insulation film 11 and the SOG film 13 within the wiring dummy pattern 9. A pad opening(s) (not shown) is formed by removing the final passivation film 17 on the electrode pad(s).

Parts (1) through (3) of FIG. 3 are process cross-sectional views illustrating a method of manufacturing a semiconductor wafer 1 according to an embodiment of the present invention. The left hand side of FIG. 3 shows a manufacturing process of the semiconductor chip area 3 in the center region of the semiconductor wafer 1. On the other hand, the right hand side of FIG. 3 shows a manufacturing process of the semiconductor chip area 3 in the peripheral region of the semiconductor wafer 1.

Step (1): As shown in part (1) of FIG. 3, semiconductor devices (not shown) such as transistors are formed in an area(s) (not shown) on the semiconductor substrate 5. The first interlayer insulation film 7 is formed on the semiconductor substrate 5. A contact hole(s) is formed in an area(s) (not shown) of the first interlayer insulation film 7. An electrically conductive material such as tungsten is embedded into the contact hole(s), and a metal material is formed on the first interlayer insulation film 7 and the contact hole(s). Then the metal material is patterned to form the wiring dummy pattern 9 and a wiring pattern(s) (not shown). The second interlayer insulation film 11 is formed on the first interlayer insulation film 7, the wiring dummy pattern 9, and the wiring pattern(s).

Step (2): As shown in part (2) of FIG. 3, the SOG film 13 is formed on the second interlayer insulation film 11 by using the spin coating method. This spin coating method is performed under the conditions that the kinematic viscosity of the SOG film 13 is 2.29 mm$^2$/s and the coating speed of the SOG is 3500 rpm (revolutions per minute). In this case, the coated SOG film 13 is formed in a manner so that within the wiring dummy pattern 9, the SOG film 13 formed in the center region of the semiconductor wafer 1 becomes thinner.

Step (3): As shown in part (3) of FIG. 3, the etch back process is performed with respect to the SOG film 13. In this case, within the wiring dummy pattern 9, the SOG film 13 remains in the vicinity of a step portion(s) of the second interlayer insulation film 11. Further, the part of the SOG film 13 formed relatively thinner upon the SOG film 13 being coated is removed. Further, in the same part where the SOG film 13 is removed, the second interlayer insulation film 11 is accordingly etched. As a result, within the wiring dummy pattern 9, the surface geometry of the second interlayer insulation film 11 and the SOG film 13 after the etch back process becomes similar to that of the SOG film 13 before the etch back process.

Step (4): As shown in part (B) of FIG. 1, the third interlayer insulation film 15 is formed on the second interlayer insulation film 11 and the SOG film 13. A via hole(s) (a contact hole(s)) is formed in an area(s) (not shown) of the third interlayer insulation film 15, the second interlayer insulation film 11 and the SOG film 13. A metal material is formed in the via hole(s) and on the third interlayer insulation film 15. Then, the metal material is patterned to form an electrode pad(s) and a wiring pattern(s) in an area(s) (not shown). After the final passivation film 17 is formed, the final passivation film 17 on the electrode pad(s) is removed to form a pad opening(s). After the semiconductor chip areas 3 in the semiconductor wafer 1 are manufactured, each of the semiconductor chip areas 3 is cut from the semiconductor wafer 1 to produce an individual semiconductor chip.

As shown in part (A) of FIG. 1, in each of the semiconductor chip areas 3, a color pattern is formed on the final passivation film 17 based on the SOG film 13 in accordance with a distance from the center of the semiconductor wafer 1. Further, the color pattern has a certain directionality with respect to the direction to the center of the semiconductor wafer 1. By using this feature, namely by visually observing the color pattern formed on a semiconductor chip cut from the semiconductor wafer 1, it becomes possible to determine the relative position of the semiconductor chip with respect to the semiconductor wafer 1 before the semiconductor chip is cut from the semiconductor wafer 1. As a result, advantageously, the position of the semiconductor chip on the surface of semiconductor wafer 1 may be traced and specified.

Further, in this embodiment, in each semiconductor chip area 3, there is the position recognition pattern 9a indicating the relative position in the one exposure range. By using the position recognition pattern 9a, it becomes possible to determine the relative position of the semiconductor chip area 3 in the one exposure range. As a result, the position of the semiconductor chip area 3 in the semiconductor wafer 1 may be determined more accurately. It should be noted that the wiring dummy pattern 9 and the position recognition pattern 9a may be formed at any position in the semiconductor chip area 3. However, preferably, each of the wiring dummy pattern 9 and the position recognition pattern 9a is formed near an edge of the semiconductor chip area 3 because production circuits are usually formed in the center area of the semiconductor chip area 3.

Further, by determining the position of position recognition pattern 9a with respect to a direction of the semiconductor wafer 1 in advance, it may become possible to easily specify which direction the semiconductor chip had been oriented on the semiconductor wafer 1 before the semiconductor chip is cut from the semiconductor wafer 1. Further, by determining the position of the wiring dummy pattern 9 in the semiconductor chip area 3 in advance (for example, it is determined that the position of the wiring dummy pattern 9 in the semiconductor chip area 3 is formed at a prescribed corner area of the any of the semiconductor chip areas 3), it may become possible to determine the position of the semiconductor chip with respect to the semiconductor wafer 1 by observing the directionality of the color pattern.

It should be noted that the position recognition pattern 9a may be formed in any wiring pattern layer.

In this example, the wiring dummy pattern 9 has a continuous frame shape. However, the shape of the wiring dummy pattern 9 of the present invention is not limited to this shape. For example, any shape such as a discontinuous frame shape including a slit portion may be used as long as the color pattern is observed within the shape.

Further, in this embodiment, the planar shape of the frame-shaped wiring dummy pattern 9 is a square. However, the planar shape of the frame-shaped wiring dummy pattern 9 in the present invention is not limited to square. For example, any shape such as a rectangle, a circle, an ellipse, and a polygon may be used.

On the other hand, when the one side of the wiring dummy pattern 9 is too short, it may become difficult to obtain enough film thickness difference of the SOG film 13 within the wiring dummy pattern 9 between the center region and a peripheral region of the semiconductor wafer 1. Also, when the length of the one side of the wiring dummy pattern 9 is too long, more than enough area for the wiring dummy pattern 9 may be unnecessarily occupied in the semiconductor chip.

FIG. 4 shows the relationship between the size of the wiring dummy pattern 9 and the observed directionality of the color pattern. Parts (A) and (B) of FIG. 4 show cases where one-side lengths of the contour inner circumference are 100 μm and 30 μm, respectively. As shown in the case of part (A) of FIG. 4, the color pattern having directionality is better observed. However, in the case of part (B) of FIG. 4, the directionality in the color pattern is hardly observed. Based on experiments, when the one-side lengths of the contour inner circumference in a square were equal to or less than 36 μm, the directionality in the color pattern was hardly generated; and when the one-side lengths of the contour inner circumference in a square were equal to or more than 48 μm, the directionality in the color pattern was better generated.

Further, when the one-side lengths of the contour inner circumference of the wiring dummy pattern 9 are increased, the color pattern may be observed more easily. However, when the one-side lengths of the contour inner circumference were equal to or greater than 100 μm, the visibility of the color pattern was not remarkably improved. Therefore, preferably, the one-side lengths of the contour inner circumference of the wiring dummy pattern 9 are in a range from approximately 50 µm to approximately 100 µm.

Next, FIG. 5 shows the relationship between the line width of the wiring dummy pattern 9 and the observed directionality of the color pattern. Parts (A) and (B) of FIG. 5 show cases where line widths of the wiring dummy pattern 9 are 10 µm and 100 µm, respectively. As shown in the case of part (A) of FIG. 5, the color pattern having directionality is better observed. However, in the case of part (B) of FIG. 5, the directionality in the color pattern is hardly observed. Therefore, preferably, the line width of the wiring dummy pattern 9 is equal to or less than approximately 10 µm.

Next, FIG. 6 shows the relationship between the total film thickness in the vertical direction of the insulation films within the wiring dummy pattern 9 and the observed directionality of the color pattern. The film thickness distribution and the film thickness difference of the SOG film 13 within the wiring dummy pattern 9 between the cases of parts (A) and (B) of FIG. 6 are substantially the same. However, the total film thickness of the insulation films in the case of part (A) of FIG. 6 is less than that in the case of part (B) of FIG. 6. As FIG. 6 shows, when the total film thickness of the insulation films is less, the film thickness difference may be more clearly observed. Therefore, preferably, when the total film thickness of the insulation films can be less, the color pattern reflecting the film thickness difference may be more clearly observed.

Next, a semiconductor wafer according to another embodiment of the present invention is described. FIG. 7 is a cross-sectional view showing the vicinity of the wiring dummy pattern 9 of the semiconductor chip area 3 in a peripheral region of the semiconductor wafer 1. As shown in FIG. 7, the films are formed in the same manner as in parts (B) and (C) of FIG. 1, except that the final passivation film 17 within the wiring dummy pattern 9 in top view is removed. In this case, the final passivation film 17 may be removed at the same time when the pad opening(s) is formed by removing the final passivation film 17 on the electrode pad(s). It should be noted that a part of the upper surface of the third interlayer insulation film 15 is also removed by over etching. In this embodiment, the color pattern within the wiring dummy pattern 9 may be more clearly observed in top view because the total film thickness of the insulation films in this embodiment may be less than that in the embodiment in parts (B) and (C) of FIG. 1.

As described above, in the case of FIG. 7, the final passivation film 17 of the insulation films within the wiring dummy pattern 9 in top view is removed. However, when plural metal wiring layers and plural interlayer insulation films are formed on the upper layer side of the wiring dummy pattern 9, the interlayer insulation films may also be removed in the same manner as the final passivation film 17 is removed as shown in FIG. 7. By doing this, the total film thickness of the insulation films in top view becomes less, thereby enabling observing the color pattern more clearly. Further, the process of etching the interlayer insulation film and the final passivation film 17 may be performed at the same time when the via hole(s) between wiring lines is formed. By doing this, the desired structure may be formed without increasing the number of manufacturing steps.

Next, a semiconductor wafer according to still another embodiment of the present invention is described. FIG. 8 is a cross-sectional view showing the vicinity of the wiring dummy pattern 9 of the semiconductor chip area 3 in a peripheral region of the semiconductor wafer 1. As shown in FIG. 8, the films are formed in the same manner as in parts (B) and (C) of FIG. 1, except that the first interlayer insulation film 7 within the wiring dummy pattern 9 in top view is removed. The first interlayer insulation film 7 may be removed at the same time when the contact hole(s) are formed in the first interlayer insulation film 7 in an area(s) (not shown).

Next, a method of manufacturing a semiconductor wafer according to another embodiment of the present invention is described. Parts (1) through (5) of FIG. 9 are process cross-sectional views illustrating a method of manufacturing the semiconductor wafer 1 in FIG. 8 according to another embodiment of the present invention.

Step (1): As shown in part (1) of FIG. 9, semiconductor devices such as transistors are formed in an area(s) (not shown) on the semiconductor substrate 5. The first interlayer insulation film 7 is formed on the semiconductor substrate 5.

Step (2): As shown in part (2) of FIG. 9, A contact hole(s) is formed in an area(s) (not shown) of the first interlayer insulation film 7, and in the same step, the first interlayer insulation film 7 within the wiring dummy pattern 9 is removed. An electrically conductive material such as tungsten is embedded into the contact hole(s), and a metal material is formed on the whole surface of the semiconductor substrate 5. Then the metal material is patterned to form the wiring dummy pattern 9 and a wiring pattern(s) (not shown).

Step (3): As shown in part(3) of FIG. 9, the second interlayer insulation film 11 is formed on the semiconductor substrate 5, the first interlayer insulation film 7, the wiring dummy pattern 9 and the wiring pattern(s).

Step (4): As show in part (4) of FIG. 9, the SOG film 13 is formed on the second interlayer insulation film 11 by the spin coating method. In this case, the coated SOG film 13 is formed in a manner so that within the wiring dummy pattern 9, the film thickness of the formed SOG film 13 in the center region of the semiconductor wafer 1 becomes less.

Step (5): As shown in part (5) of FIG. 9, the etch back process is performed with respect to the SOG film 13. In this case, within the wiring dummy pattern 9, the SOG film 13 remains in the vicinity of a step portion(s) of the second interlayer insulation film 11. Further, the part of the SOG film 13 formed relatively thinner upon the SOG film 13 being coated is removed. Further, in the same part where the SOG film 13 is removed, the second interlayer insulation film 11 is accordingly etched. As a result, within the wiring dummy pattern 9, the surface geometry of the second interlayer insulation film 11 and the SOG film 13 after the etch back process becomes similar to that of the SOG film 13 before the etch back process.

Step (6): As shown in FIG. 8, the third interlayer insulation film 15 is formed on the second interlayer insulation film 11 and the SOG film 13. A via hole(s) (a contact hole(s)) is formed in an area(s) (not shown) of the third interlayer insulation film 15, the second interlayer insulation film 11 and the SOG film 13. A metal material is formed in the via hole(s) and on the third interlayer insulation film 15. Then, the metal material is patterned to form an electrode pad(s) and a wiring pattern(s) in an area(s) (not shown). After the final passivation film 17 is formed, the final passivation film 17 on the electrode pad(s) is removed to form a pad opening(s).

In the embodiment shown in FIG. 8, the total film thickness of the insulation films within the wiring dummy pattern 9 becomes less than that in the embodiment shown in parts (B) and (C) of FIG. 1, thereby enabling observing the color pattern in top view more clearly.

Further, as shown in part (2) of FIG. 9, the difference of height levels between the top of the wiring dummy pattern 9 and the inside of the wiring dummy pattern 9 may become greater than that in a case of parts (B) and (C) of FIG. 1 because the first interlayer insulation film 7 within the wiring dummy pattern 9 is removed. As a result, the film thickness difference of the SOG film 13 may become larger, thereby enabling observing the color pattern on the surface of the final passivation film 17 within the wiring dummy pattern 9 in top view more clearly.

Further, currently and continually, as semiconductors are becoming more highly integrated and more densely fabricated, the chemical mechanical polishing (CMP) process is becoming more and more widely used. Advantageously, even in a case where the CPM process is used for nearly flattening an interlayer insulation film, by removing an interlayer insulation film disposed under the wiring dummy pattern 9, it becomes possible that the interlayer insulation film within the wiring dummy pattern 9 in top view is not flattened by the CPM process, thereby enabling using the method of observing the color pattern based on the film thickness difference in accordance with the position on the semiconductor wafer.

Further, in the structure described with reference to FIG. 8, the final passivation film 17 within the wiring dummy pattern 9 in top view may be removed as shown in FIG. 7. By combining the processes, the color pattern may be observed much more clearly.

Further, even after the CPM process is performed and the interlayer insulation film is nearly flattened, by forming a dummy pattern(s) in the wiring layer of the uppermost layer, forming an insulation layer, coating the SOG film, performing an etch back process when necessary, and accumulating an insulation film, the color pattern may also be observed in the same manner as described above.

Next, a semiconductor wafer according to still another embodiment of the present invention is described. FIG. 10 is a cross-sectional view showing the vicinity of the wiring dummy pattern 19 of the semiconductor chip area 3 in a peripheral region of the semiconductor wafer 1.

In a semiconductor wafer according to this embodiment, as shown in FIG. 10, the wiring dummy patterns 19 are formed in the uppermost metal wiring layer and on the third interlayer insulation film 15. An insulation film 21 is formed on the third interlayer insulation film 15 and the wiring dummy patterns 19. Then, the SOG film 23 is formed on the insulation film 21 by using the spin coating method and the etch back process. An insulation film 25 is formed on the insulation film 21 and the SOG film 13. The final passivation film 17 is formed on the insulation film 25.

Further, the CMP process is performed on the third interlayer insulation film 15.

As described above, in the semiconductor wafer according to this embodiment of the present invention, the wiring dummy patterns 19 are formed in the uppermost metal wiring layer, and the SOG film 23 is formed on the upper side of the wiring dummy patterns 19. Because of this structure, the color pattern in accordance with the distance from the center of the semiconductor wafer 1 may be formed on the surface of the final passivation film 17 within the wiring dummy patterns 19 in top view.

Further, in a case where there are plural metal wiring layers, the wiring dummy patterns may be formed in each of the metal wiring layers, one of the metal wiring layers, or any combinations of the plural metal wiring layers.

Next, a semiconductor wafer according to still another embodiment of the present invention is described. FIG. 11 is a cross-sectional view showing the vicinity of the wiring dummy pattern 9 of the semiconductor chip area 3 in a peripheral region of the semiconductor wafer 1. In FIG. 11, the same reference numerals are used for the elements having the same functions as those in part (C) of FIG. 1.

As shown in FIG. 11, the first interlayer insulation film 7 is formed on the semiconductor substrate 5. The wiring dummy pattern 9 is formed on the first interlayer insulation film 7. The second interlayer insulation film 11 is formed on the first interlayer insulation film 7 and the wiring dummy pattern 9. The SOG film 13 is formed on the second interlayer insulation film 11. The third interlayer insulation film 15 (underlying insulation film) is formed on the second interlayer insulation film 11 and the SOG film 13.

Further, a wiring dummy pattern 26 included in a second metal wiring layer is formed on the third interlayer insulation film 15. A fourth interlayer insulation film 27 is formed on the third interlayer insulation film 15 and the wiring dummy patterns 26. An SOG film 29 is formed on the fourth interlayer insulation film 27. A fifth interlayer insulation film 31 (underlying insulation film) is formed on the fourth interlayer insulation film 27 and the SOG film 29. The wiring dummy patterns 26, the fourth interlayer insulation film 27, the SOG film 29, and the fifth interlayer insulation film 31 are formed in the same manner as the wiring dummy pattern 9, the second interlayer insulation film 11, the SOG film 13, and the third interlayer insulation film 15 are formed, respectively.

Further, a wiring dummy pattern 33 included in a third metal wiring layer is formed on the fifth interlayer insulation film 31. A sixth interlayer insulation film 35 is formed on the fifth interlayer insulation film 31 and the wiring dummy patterns 33. An SOG film 37 is formed on the sixth interlayer insulation film 35. A seventh interlayer insulation film 39 is formed on the sixth interlayer insulation film 35 and the SOG film 37. The wiring dummy patterns 33, the sixth interlayer insulation film 35, the SOG film 37, and the seventh interlayer insulation film 39 are formed in the same manner as the wiring dummy pattern 9, the second interlayer insulation film 11, the SOG film 13, and the third interlayer insulation film 15 are formed, respectively.

The final passivation film 17 is formed on the seventh interlayer insulation film 39. The surface geometry of the final passivation film 17 within the wiring dummy pattern 9 in top view reflects that of the sixth interlayer insulation film 35 and the SOG film 37 within the wiring dummy pattern 33.

As described above, by forming plural wiring dummy patterns 9, 25, and 33 in the corresponding metal wiring layers, the color pattern in accordance with the distance from the center of the semiconductor wafer 1 may be more remarkably formed.

Next, a semiconductor wafer according to still another embodiment of the present invention is described. FIG. 12 is a cross-sectional view showing the vicinity of the wiring dummy pattern 9 of the semiconductor chip area 3 in a peripheral region of the semiconductor wafer 1.

In this embodiment, the configuration of the films is different from that in the embodiment shown in parts (B) and (C) of FIG. 1 in that dummy via holes (dummy contact holes) 41 are formed through the third interlayer insulation film 15, the SOG film 13, and the second interlayer insulation film 11 within the wiring dummy pattern 9. The planar shape in top view of the dummy via holes 41 is a square having sides of 0.5 µm, and the dummy via holes 41 are arranged at pitch of 0.5 µm within the wiring dummy pattern 9 in top view. The dummy via holes 41 are formed at the same time when the via hole(s) is formed in an area(s) (not shown). The bottom part of some dummy via holes 41 reaches the first interlayer insulation film 7. A metal material is embedded in the dummy via holes 41.

In each of the semiconductor chip area 3 arranged on the semiconductor wafer 1, the planar size of the dummy via holes 41 on the exposure photomask is the same. However, when the dummy via holes 41 are formed through the third interlayer insulation film 15, the SOG film 13, and the second interlayer insulation film 11, due to existence of the SOG film 13, the height of the upper surface of the insulation film 15 in the center region of the semiconductor wafer 1 is different from that in the peripheral region of the semiconductor wafer 1 within the wiring dummy pattern 9 in top view. Due to the height difference of the insulation film to be etched when a photoresist pattern is formed in a photo engraving process, the planar size of the formed dummy via holes 41 may differ in proportion to the height difference. By using this feature, it may become possible to determine the position of the semiconductor chip area 3 with respect to the semiconductor wafer 1 by observing the planer size of the formed dummy via holes 41, thereby enabling the tracing of the position of the semiconductor chip on the surface of semiconductor wafer 1.

Part (A) and part (B) of FIG. 13 show the color patterns on the surface of the insulation film within the wiring dummy pattern 9 in top view when the dummy via holes 41 are not formed (Without holes) and when the dummy via holes 41 are formed (With holes), respectively. In both cases shown in parts (A) and (B) of FIG. 13, the film thickness distribution due to the film thickness difference of the SOG film may be recognized by observing the corresponding color patterns.

Further, as described above, in the "With holes" case of part (B) of FIG. 13, by observing the planar size of the dummy via holes 41, the position of the semiconductor with respect to the semiconductor wafer 1 may be determined. Advantageously, this position determining method based on observing the planar size of the dummy via holes 41 may hardly be affected even when the total film thickness of the insulation films within the wiring dummy pattern 9 in top view is increased, unlike the position determining method based on observing the color pattern.

Although semiconductor wafers, the semiconductor chips, and the method of manufacturing the semiconductor chips according to the embodiments of the present invention are described, the present invention is not limited to those embodiments. Namely, for example, materials, sizes, shapes, and arranging positions described in above embodiments are examples only. It will be understood by one skilled in the art that various modifications and changes may be made without departing from the spirit and scope of the present invention.

What is claimed is:

1. A semiconductor wafer comprising:
   plural semiconductor chip areas arranged in a matrix manner on the semiconductor wafer;
   each of the semiconductor chip areas including
      an underlying insulation film,
      a wiring pattern formed on the underlying insulation film,
      a frame-shaped wiring dummy pattern formed on the underlying insulation film,
      plural insulation films formed on the upper side of the underlying insulation film, the wiring pattern, and the wiring dummy pattern, and
      at least one SOG film included in the plural insulation films, wherein
   a color pattern in accordance with a distance from a center of the semiconductor wafer based on the SOG film is formed on a surface of the insulator films within the wiring dummy pattern in top view.

2. The semiconductor wafer according to claim 1, wherein the underlying insulation film within the wiring dummy pattern in top view is removed.

3. The semiconductor wafer according to claim 1, wherein there are plural insulation films on the upper side of the SOG film, and
   a part of the plural insulation films on the upper side of the SOG film and within the wiring dummy pattern in top view is removed.

4. The semiconductor wafer according to claim 3, wherein the removed part of the plural insulation films on the upper side of the SOG film is a final passivation film.

5. The semiconductor wafer according to claim 1, wherein plural dummy contact holes are formed in the insulation film on the upper side of the SOG film and within the wiring dummy pattern in top view.

6. The semiconductor wafer according to claim 1, wherein each of the semiconductor chip areas further includes plural metal wiring layers, and
   the wiring dummy pattern is formed of a metal of the uppermost metal wiring layer.

7. The semiconductor wafer according to claim 1, wherein each of the semiconductor chip areas further includes plural metal wiring layers, and
   the wiring dummy patterns are formed in the plural metal wiring layers.

8. The semiconductor wafer according to claim 1, wherein the semiconductor chip areas are formed by using an exposure photomask having a pattern corresponding to plural semiconductor chip areas and performing plural exposure processes while a position of the exposure is scanned, and
   a position recognition pattern indicating the relative position in one exposure range is formed in each of the semiconductor chip areas.

9. A semiconductor chip cut from a semiconductor wafer according to claim 1.

10. A method of manufacturing a semiconductor wafer on which plural semiconductor chip areas are arranged in a matrix manner, the method comprising:
    a step of forming a wiring pattern and a frame-shaped wiring dummy pattern on an underlying insulation film in each of the semiconductor chip areas; and
    a step of forming plural insulation films including at least one SOG film on the upper side of the underlying insulation film, the wiring pattern, and the wiring dummy pattern, wherein
    a color pattern in accordance with a distance from the center of the semiconductor wafer based on the SOG film is formed on a surface of the insulator film within the wiring dummy pattern in top view.

11. The method of manufacturing a semiconductor according to claim 10, wherein
    a step of removing the underlying insulation film within the wiring dummy pattern in top view is performed before the SOG film is formed.

12. The method of manufacturing a semiconductor according to claim 11, wherein
    the step of removing the underlying insulation film is performed at the same time when contact holes are formed in the underlying insulation film.

13. The method of manufacturing a semiconductor according to claim 10, wherein
    the step of forming plural insulation films is a step of forming plural insulation films on the SOG film and includes a step of removing a part of the plural insulation films on the upper side of the SOG film and within the wiring dummy pattern in top view.

14. The method of manufacturing a semiconductor according to claim 13, wherein
the step of removing the part of the plural insulation films on the upper side of the SOG film is a step of removing a final passivation film.

15. The method of manufacturing a semiconductor according to claim 14, wherein
the step of removing the final passivation film is performed at the same time when an electrode pad opening is formed in the final passivation film.

16. The method of manufacturing a semiconductor according to claim 10, wherein
the step of forming plural insulation films is a step of forming the plural insulation films on the SOG film, and includes a step of forming plural dummy contact holes in the insulation film on the upper side of the SOG film and within in the wiring dummy pattern in top view.

17. The method of manufacturing a semiconductor according to claim 16, wherein
the step of forming the plural dummy contact holes is performed at the same time when a dummy contact hole in the insulation film on the upper side of the SOG film is formed.

18. The method of manufacturing a semiconductor according to claim 10, wherein
each of the semiconductor chip areas further includes plural metal wiring layers, and
the wiring dummy pattern is formed of a metal of the uppermost metal wiring layer.

19. The method of manufacturing a semiconductor according to claim 10, wherein
each of the semiconductor chip areas further includes plural metal wiring layers, and
the wiring dummy patterns are formed in the plural metal wiring layers.

20. The method of manufacturing a semiconductor according to claim 10, wherein
the semiconductor chip area is formed by using an exposure photomask having a pattern corresponding to plural semiconductor chip areas and performing plural exposure processes while a position of the exposure is scanned for each pattern layer,
at least one of plural kinds of exposure photomasks prepared for the corresponding pattern layers and including a position recognition pattern indicating a relative position in one exposure range is used, so that the position recognition pattern indicating a relative position in one exposure range is formed on each semiconductor chip area.

* * * * *